(12) United States Patent
Lee et al.

(10) Patent No.: US 12,167,530 B2
(45) Date of Patent: Dec. 10, 2024

(54) ELECTROMAGNETIC INTERFERENCE SHIELDING ENCLOSURE WITH THERMAL CONDUCTIVITY

(71) Applicant: Intel Corporation, Santa Clara, CA (US)

(72) Inventors: Jaejin Lee, Hillsboro, OR (US); James Panakkal, KA (IN); Min Suet Lim, Penang (MY); Aiswarya M. Pious, Karnataka (IN)

(73) Assignee: Intel Corporation, Santa Clara, CA (US)

( * ) Notice: Subject to any disclaimer, the term of this patent is extended or adjusted under 35 U.S.C. 154(b) by 843 days.

(21) Appl. No.: 17/127,407

(22) Filed: Dec. 18, 2020

(65) Prior Publication Data
US 2021/0153340 A1    May 20, 2021

(51) Int. Cl.
*H05K 1/02* (2006.01)
*H05K 9/00* (2006.01)

(52) U.S. Cl.
CPC ......... *H05K 1/0224* (2013.01); *H05K 1/0236* (2013.01); *H05K 9/0024* (2013.01); *H05K 2201/10371* (2013.01)

(58) Field of Classification Search
CPC .. H05K 1/0024; H05K 1/0236; H05K 9/0024; H05K 2201/10371
USPC ....................................................... 174/255
See application file for complete search history.

(56) References Cited

U.S. PATENT DOCUMENTS

| | | | |
|---|---|---|---|
| 5,335,147 A  * | 8/1994  | Weber | H05K 7/1461 174/359 |
| 10,349,565 B2 | 7/2019 | Mundell et al. | |
| 2012/0320558 A1 | 12/2012 | Foster et al. | |
| 2015/0342031 A1* | 11/2015 | Song | H01Q 17/00 29/464 |
| 2017/0170085 A1* | 6/2017 | Gwin | H01L 23/10 |
| 2018/0070484 A1* | 3/2018 | Mundell | H05K 1/0265 |
| 2019/0311994 A1* | 10/2019 | Hong | H01L 21/56 |
| 2019/0378802 A1* | 12/2019 | Ito | H05K 9/0037 |

FOREIGN PATENT DOCUMENTS

| | | | | |
|---|---|---|---|---|
| EP | 3589104 A1 | 1/2020 | | |
| WO | WO-2019193868 A1 * | 10/2019 | ............. | H01L 23/04 |

OTHER PUBLICATIONS

Extended European Search Report mailed Apr. 13, 2022 for European Patent Application No. 21198626.0, 11 pages.

* cited by examiner

*Primary Examiner* — Andargie M Aychillhum
(74) *Attorney, Agent, or Firm* — Banner & Witcoff Ltd.

(57) ABSTRACT

Embodiments described herein may be related to apparatuses, processes, and techniques related to EMI shielding and thermal conduction without using any surface area of a PCB. Embodiments of the EMI shield may include a planar top, with one or more walls extending from the planar top to a bottom surface of the PCB, the PCB having a top surface disposed between the bottom surface of the PCB and the planar top. A ground of the PCB may electrically couple with the one or more walls. The bottom of the walls may couple with an EMI gasket applied to a bottom chassis to increase the volume of EMI shielding. Other embodiments may be described and/or claimed.

19 Claims, 9 Drawing Sheets

ELECTROMAGNETIC INTERFERENCE SHIELDING ENCLOSURE WITH THERMAL CONDUCTIVITY

FIELD

Embodiments of the present disclosure generally relate to the field of computing devices, and in particular to electromagnetic interference (EMI) shielding and thermal solutions for printed circuit boards (PCB).

BACKGROUND

Continued growth in computing that includes wireless access will continue to increase the demand for EMI shielded components placed on PCBs or other substrates.

DETAILED DESCRIPTION

Embodiments described herein may include apparatus, systems, techniques, or processes related to providing motherboards, or other PCB, with EMI shielding that also provides thermal conductivity. In embodiments, this is done without consuming any area on the surface of the PCB. Embodiments of the EMI shield may include a planar top, with one or more walls each with a top edge physically and electrically coupled with a surface of the planar top, the one or more walls substantially perpendicular to the surface of the planar top.

In embodiments, the planar top and the one or more walls substantially enclose a portion of a PCB that may be substantially parallel to the planar top, wherein the one or more walls extend from the surface of the planar top to a bottom surface of the PCB, the PCB having a top surface disposed between the bottom surface of the PCB and the planar top, and wherein the planar top and the one or more walls include material that is thermally conductive and provides EMI shielding for one or more components within the enclosed portion of the PCB.

As wireless antennas and wireless technology in general are positioned closer to motherboards or other substrates that connect sensitive components, controlling radio frequency interference (RFI), or EMI in general, is becoming increasingly important. This is particularly true as overall solutions become smaller and portable, and increasingly include powerful radio antennas integrated with products. Good EMI mitigation, particularly in mobile personal computing (PC) devices, is important to deliver both high computing performance and high quality radio connectivity. This radio connectivity may include wireless wide area networking (WWAN), 4G, 5G, or Wi-Fi.

Legacy EMI shielding implementations have been used to reduce EMI risk in mobile PCs. However, these implementations have resulted in a higher Z-height for the PCB package, and also consume valuable real estate on the surface of the PCB that may be otherwise be used for additional components. In addition, some legacy implementations have included EMI absorber sheets that are placed in various areas to attenuate unwanted noise radiation. EMI absorber sheets tend to be expensive, and they often need an area that is twice the footprint area of an EMI generation sources. This may get very expensive when the EMI sources are spread throughout a system.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Figure 1:
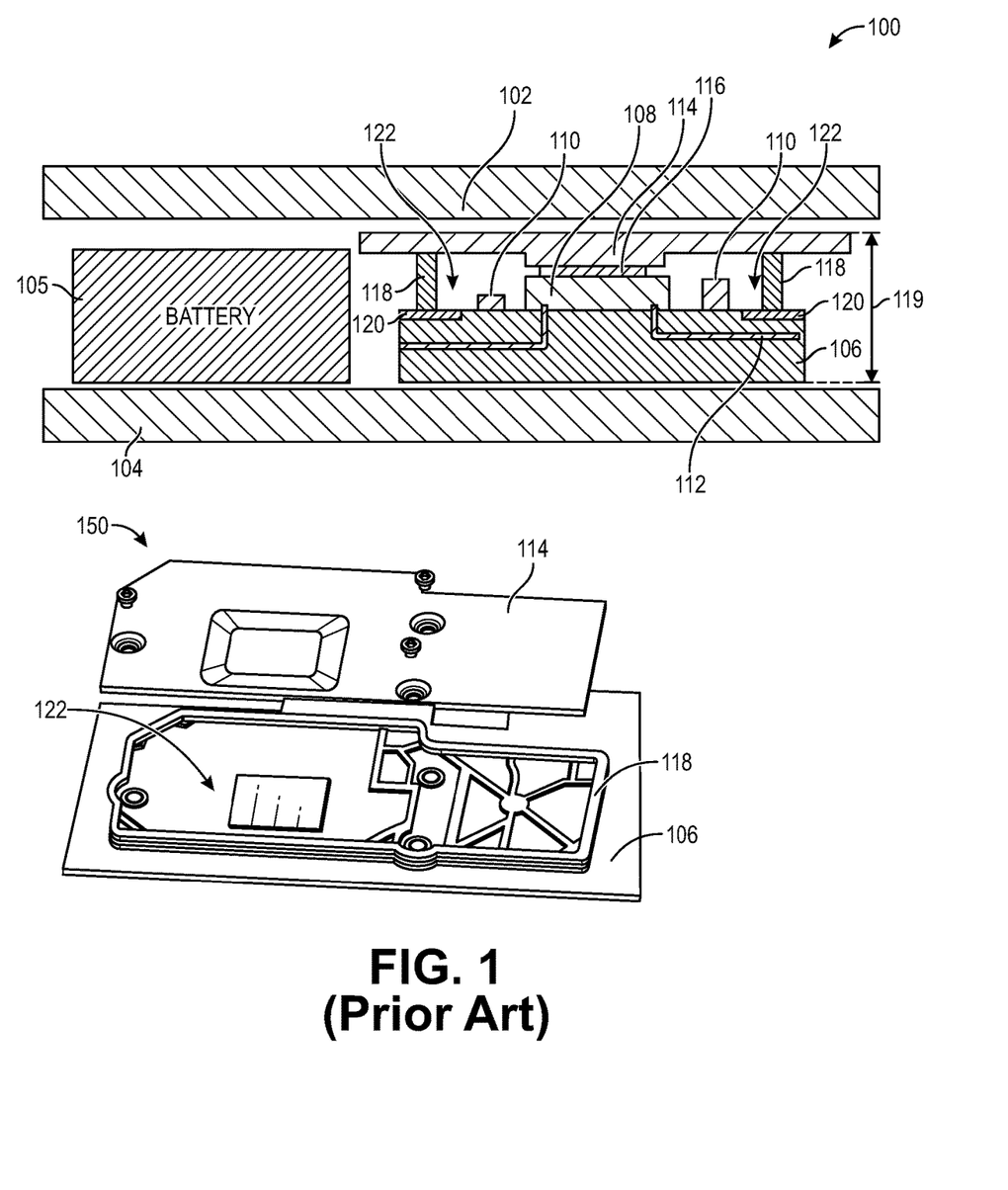
FIG. 1 is a diagram including a side view and a perspective view of a legacy shielding solution for a motherboard.

FIG. 1 is a diagram including a side view and a perspective view of a legacy shielding solution for a motherboard. Legacy implementation 100 shows a motherboard 106 that may be placed on a bottom chassis 104. In implementations, the motherboard 106 may be mounted on or screwed into the bottom chassis 104. Other components, such as a battery 105, may also be secured to the bottom chassis 104 to provide power for the motherboard 106 or other components (not shown) that may be included in the legacy implementation 100. Note that a second chassis 102, which may be referred to as a top chassis, maybe applied to cover the motherboard 106 and battery component 105.

A die 108 may be placed on the motherboard 106. In implementations, the die 108 may be a system on chip (SOC). In other implementations, it may be a XPU that may include a central processing unit (CPU), graphics processing unit (GPU), field programmable gate array (FPGA), application specific integrated circuit (ASIC), accelerator, or some other processing die. The die 108 may be electrically coupled through one or more electrical routings 112 in the motherboard 106.

In legacy implementations, the die 108 may be thermally or electrically coupled with an integrated heat spreader (IHS) 114 that also includes EMI shielding properties. In implementations, a thermal interface material (TIMs) 116 may be used to help thermally or physically couple the die 108 to the IHS 114. In legacy implementations, various other components 110 may be positioned on the surface of the motherboard 106. These other components 110 may have various sensitivities to EMI may not function correctly if subjected to excessive EMI.

In legacy implementations, an EMI shield fence 118 may extend from a side of the IHS 114 and extend down to a surface of the motherboard 106. In implementations, the EMI shield fence 118 may include aluminum, steel, nickel, silver, tin, or other metallic materials. In legacy implementations, the EMI shield fence 118 extends to a surface of the motherboard 106, and comes into electrical contact with a PCB electrical ground 120 on the surface of the motherboard 106. This electrical contact allows the EMI shield fence 118 and the IHS 114 to provide a partial Faraday cage-like effect to prevent the die 108 or components 110 from receiving excessive EMI. As a result, the regions 122 may receive good EMI shielding. However, lower portions of the motherboard 106 that are closer to the bottom chassis 104, as well as any electrical routings within the lower portion of the motherboard 106, have diminished EMI shielding. In addition, in legacy implementations, because the EMI shield fence 118 only goes to a surface of the motherboard 106, this design increases the overall Z-height 119 based on a required depth of the EMI shield fence 118, rather than based on the height requirements of components 110 or die 108.

Legacy implementation 150 shows a partial perspective view of legacy implementation 150. Here, EMI shield fence 118 circumscribes an area on top of the motherboard 106, to which components such as components 110 may not be physically coupled. The IHS 114, which may be referred to in legacy implementations as an EMI shield lid, is placed on top of the EMI shield fence 118 when assembled. Legacy implementations also may cause difficulty with servicing components 110 and die 108. Because the EMI shield fence 118 may be glued or otherwise adhered to the surface of the motherboard 106, and also secured to the IHS 114, when the IHS 114 is removed for servicing, it will rip up and/or damage the surface of the motherboard 106. This makes it extremely difficult to reassemble the IHS 114 back on the motherboard 106 with all appropriate electrical connections and original functionality restored.

Figure 2:
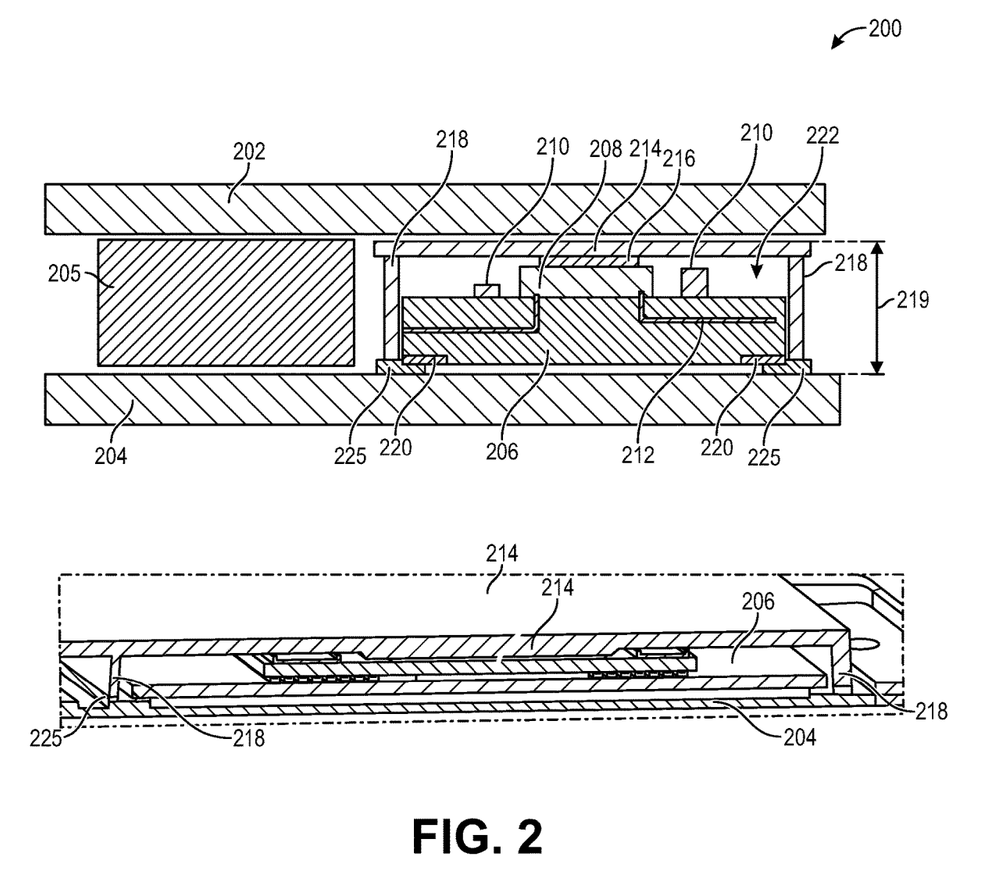
FIG. 2 is a diagram showing a side view and a perspective view of EMI shielding or thermal solutions that extend past the motherboard, in accordance with various embodiments.

FIG. 2 is a diagram showing a side view and a perspective view of EMI shielding or thermal solutions that extend past the motherboard, in accordance with various embodiments. System 200 includes a motherboard 206, the may be similar to motherboard 106 of FIG. 1, that may be physically coupled with a bottom chassis 204 that may be similar to bottom chassis 104. In embodiments, a top chassis 202 may also be included. The motherboard 206 may include electrical routing 212, similar to electrical routing 112, which may be either internal to or on a surface of the motherboard 206, or both. A die 208, which may be similar to die 108, as well as other components 210, which may be similar to other components 110 may be attached to the surface of the motherboard 206. A battery 205, which may be similar to battery 105 of FIG. 1, may be physically coupled with the bottom chassis 204.

A top EMI shield 214, which also includes thermally conductive properties and may serve as an integrated heat spreader, may be thermally and/or physically coupled with the die 208. In embodiments, a TIM 216, which may be similar to TIM 116 of FIG. 1, may be disposed between the top EMI shield 214 and the die 208.

Unlike the legacy implementations of FIG. 1, EMI walls 218 extend from the top EMI shield 214, past the motherboard 206, to a bottom surface of the motherboard 206 proximate to the bottom chassis 204. There may be one or more EMI walls 218 that are physically and electrically coupled with the top EMI shield 214, and physically and electrically coupled with each other. In embodiments, the EMI walls 218 may be machined out of an initially thicker plate of top EMI shield 214. In embodiments, the EMI walls 218 may be attached to the top EMI shield 214 and extend down to the bottom surface of the motherboard 206.

In embodiments, the EMI walls 218 are electrically coupled with a ground 220. In embodiments, the ground 220 may be ground strips or ground pads that may be designed with a solder resist opening at the bottom edges of the motherboard 206. In embodiments, exposed ground strips or ground pads may be electrically coupled to the motherboard 206 internal ground layer, discussed further with respect to FIG. 3.

In embodiments, the EMI walls 218 may be coupled with an EMI gasket 225. In embodiments, this may be referred to as an EMI conductive gasket. In embodiments, the EMI gasket 225 may be made of any electrical conductive materials. In embodiments, the EMI gasket 225 may be compressible. In embodiments, the EMI gasket 225 may flow under a portion of the motherboard 206 to provide greater EMI shielding for the entirety of the motherboard 206 as well as the components 210 and die 208 coupled with the top of the motherboard 206.

In embodiments, the EMI walls 218 descending from the top EMI shield 214 sitting on the EMI gasket 225 will form a full Faraday cage. In addition, there may be a total Z-height reduction due to no minimum distance requirements of the EMI walls 218 from the top EMI shield 214 to the bottom of the motherboard 206. In embodiments, instead of reducing the height 219, it may be maintained at the legacy height 119, providing additional airspace 222 that may facilitate cooling of the components 210 and/or die 208. As a result, embodiments provide a thermally integrated EMI shielding solution that uses no area of the surface of the motherboard 206. In embodiments, this may be referred to as using no real estate of the surface of the motherboard 206 for the integrated EMI shielding solution. It should be appreciated that the term motherboard, PCB, or a substrate may be used interchangeably herein.

Figure 3:
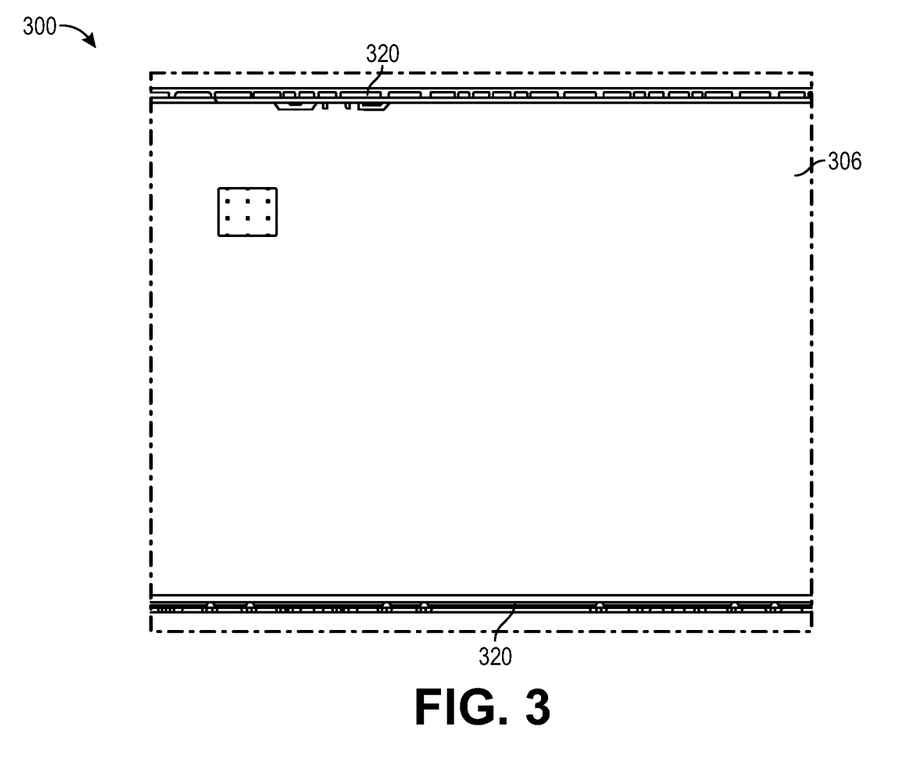
FIG. 3 is a diagram that shows the bottom side of the motherboard that includes electrical grounding, in accordance with various embodiments.

FIG. 3 is a diagram that shows the bottom side of the motherboard that includes electrical grounding, in accordance with various embodiments. Diagram 300, shows a section of the motherboard 306, which may be similar to a bottom side (or backside) of motherboard 206 of FIG. 2. Electrical grounding strips/grounding pads 320 at the edge of the motherboard 306 may be used to electrically couple the EMI walls 218 with a ground as shown with respect to FIG. 2. This may allow the EMI walls 218, that are electrically coupled with the top EMI shield 214, to provide a Faraday cage affect around the motherboard 306 and its associated components coupled at the top surface of the motherboard 306.

Figure 4:
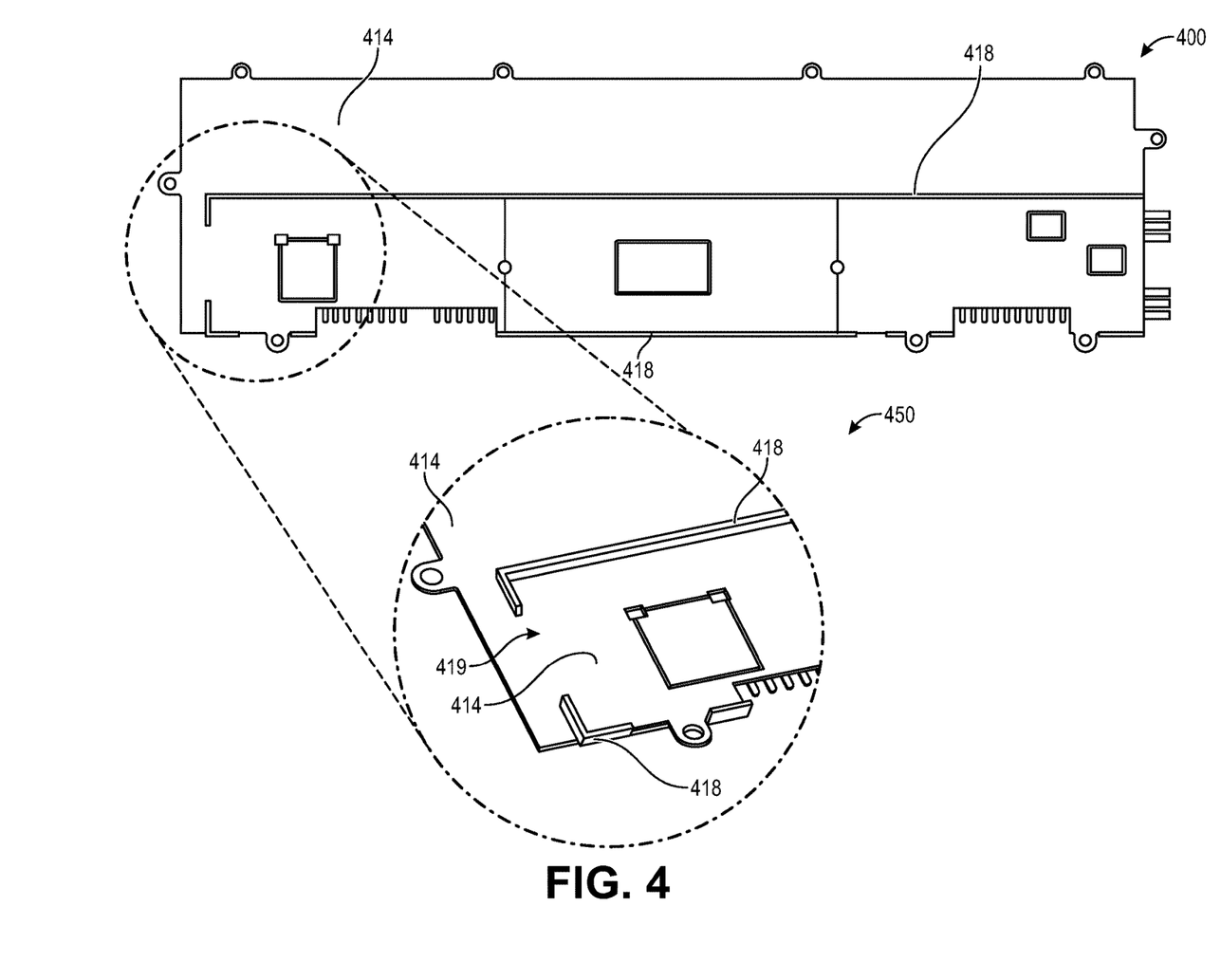
FIG. 4 shows a top view and a perspective view of a top EMI shield and thermal solution that includes walls to be placed over a motherboard, in accordance with various embodiments.

FIG. 4 shows a top view and a perspective view of a top EMI shield and thermal solution that includes walls to be placed over a motherboard, in accordance with various embodiments. Component diagram 400, includes a top EMI shield 414, which may be similar to top EMI shield 214 of FIG. 2, which may be made from various EMI shielding and thermally conductive material, including vapor chamber, heat spreader, and graphite. Component diagram 400 shows the top EMI shield 414 from an underneath side. In embodiments, the side that would be facing the motherboard 206.

In embodiments, the EMI walls 418, which may be similar to EMI walls 218 of FIG. 2, may be positioned within the top EMI shield 414. In embodiments, the top EMI shield 414 may be machined down, resulting in the EMI walls 418 that may form a unibody structure with the top EMI shield 414. In other embodiments, EMI walls 418 may be positioned on the top EMI shield 414, for example by placing a line of solder or of some other material having EMI shielding properties and/or thermally conductive properties.

Component diagram 450 shows a perspective view of a section of component diagram 400. Here, the EMI walls 418 have a height from the bottom surface of the top EMI shield 414 that may vary depending upon, for example, a thickness of the motherboard 206. It should be noted that in some areas there may be openings 419 in the EMI walls 418 due to I/O connectors. The openings can be closed by extended fingers 731 or any other electrical sealing mechanism.

Figure 5:
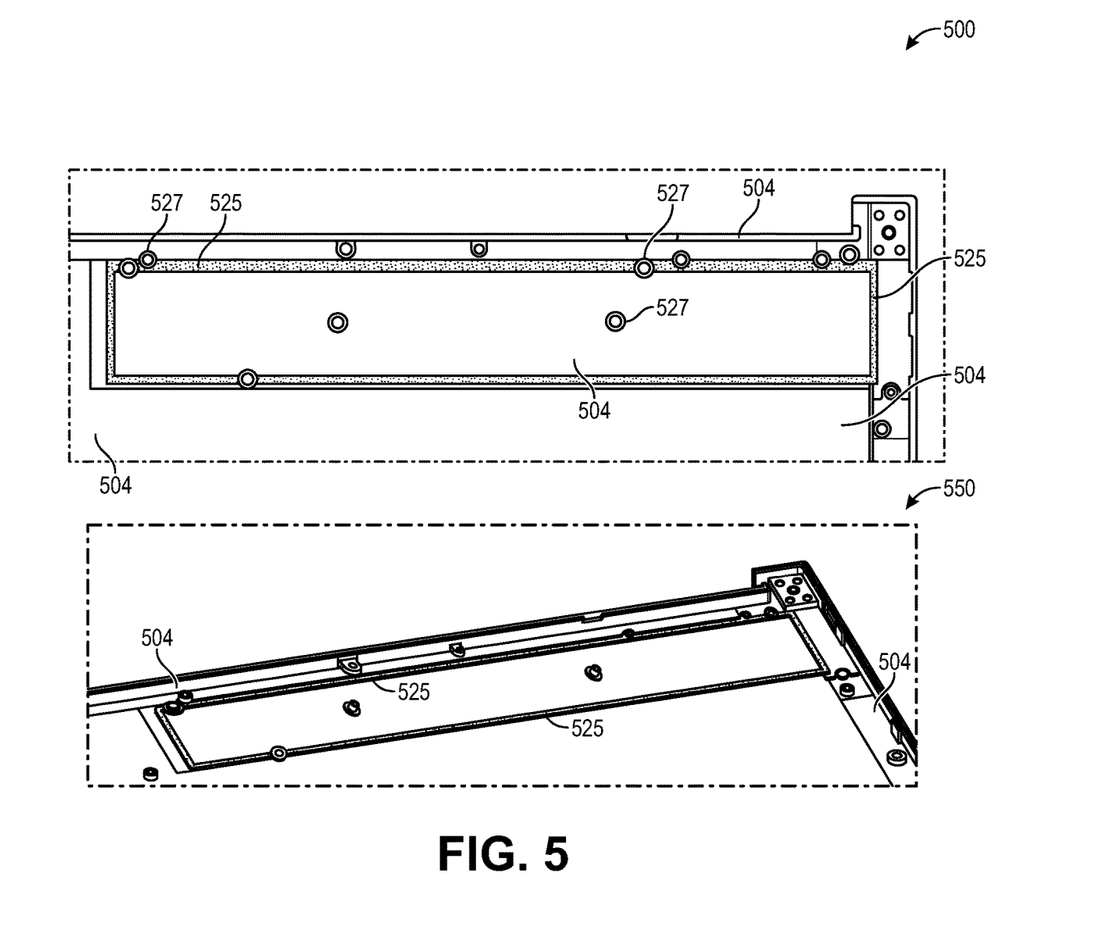
FIG. 5 shows a top view and a perspective view of an EMI gasket that is placed on a chassis onto which a motherboard is to be placed, in accordance with various embodiments.

FIG. 5 shows a top view and a perspective view of an EMI gasket that is placed on a chassis onto which a motherboard is to be placed, in accordance with various embodiments. Top down view 500 shows a bottom chassis 504, which may be similar to bottom chassis 204 of FIG. 2. In embodiments, the chassis may hold and/or secure a motherboard, such as motherboard 206 of FIG. 2, using fasteners 527. In embodiments, the fasteners may be one or more screws or one or more clip fasteners.

An EMI gasket 525 may be placed on the bottom chassis 504. In embodiments, the EMI gasket 525 will be placed on areas such that when the EMI top shield, such as EMI top shield 414 of FIG. 4, is placed on the bottom chassis, the one or more EMI walls 418 will come into contact with the EMI gasket 525. This contact will provide a continuous level of EMI shielding from the EMI wall 418 through the EMI gasket 525.

In embodiments, the EMI gasket 525 may be placed over fasteners 527, or fastener openings, as the EMI gasket 525 is applied. In embodiments, the width of the applied EMI gasket 525 may range from a width of the EMI walls 418, to a much wider width that may allow the EMI gasket 525 to extend beneath the motherboard 206 when the motherboard is placed, as discussed in more detail with respect to FIG. 6.

Figure 6:
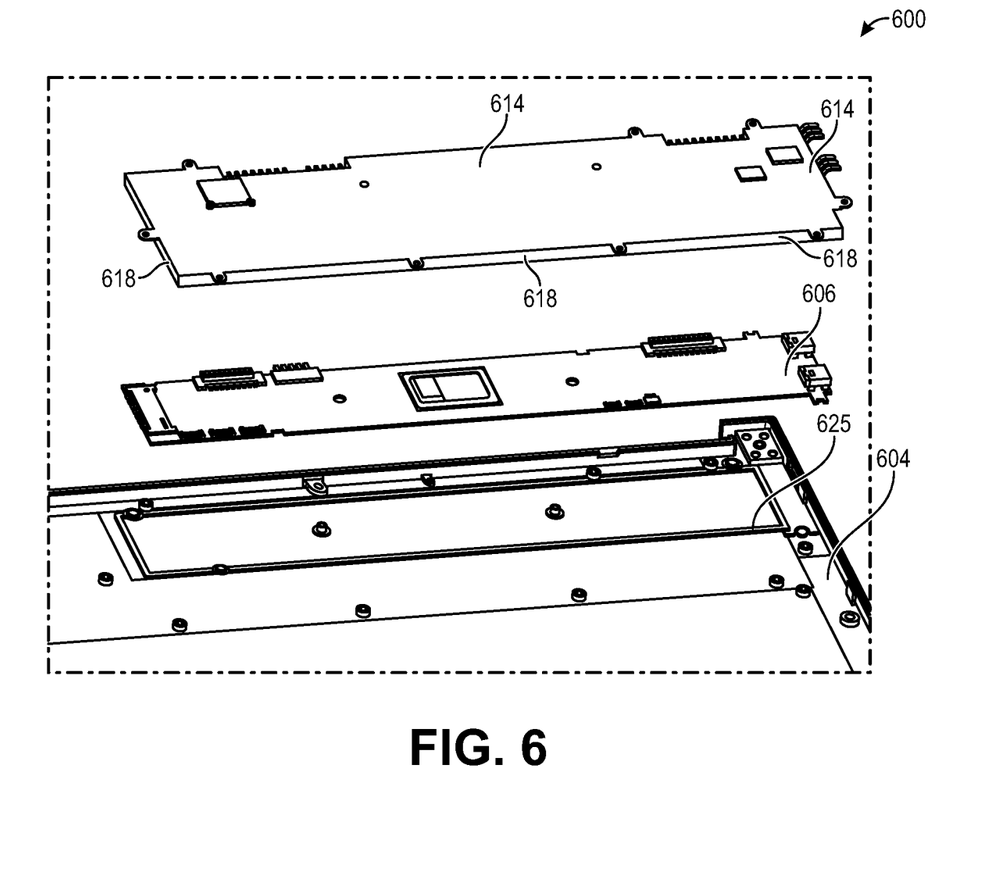
FIG. 6 shows an exploded view of a top EMI shield, motherboard, and bottom chassis to be coupled, in accordance with various embodiments.

FIG. 6 shows an exploded view of a top EMI shield, motherboard, and bottom chassis to be coupled, in accordance with various embodiments. Exploded view 600 shows a bottom chassis 604 and EMI gasket 625, which may be similar to bottom chassis 504 and EMI gasket 525 of FIG. 5.

Motherboard 606, which may be similar to motherboard 206 of FIG. 2, is positioned to be placed onto the bottom chassis 604. In some embodiments, the motherboard 606 may be placed completely within a region surrounded by the EMI gasket 625. In other embodiments the motherboard 606 may be placed on or partially on EMI gasket 625.

Once the motherboard 606 has been placed on the bottom chassis 604, the top EMI shield 614, which may be similar to the top EMI shield 514 of FIG. 5, and/or 214 of FIG. 2, may be placed over the motherboard 606. In embodiments, the EMI walls 618, which may be similar to EMI walls 518 of FIG. 5, or 218 of FIG. 2, will seat into the EMI gasket 625 that has been applied to bottom chassis 604.

In other embodiments, there may be multiple motherboards (not shown but similar to motherboard 606), in different configurations, that may be covered by the top EMI shield 614 and EMI walls 618. In embodiments, the multiple motherboards (not shown) may be substantially in a plane, and surrounded and/or placed on EMI gasket 625. In other embodiments, there may be openings on a motherboard (not shown) that may allow portions of EMI walls 618 to pass through the openings and to physically couple with an EMI gasket. In embodiments, there may be one or more cold plates or other thermal solutions that may be thermally coupled with the top EMI shield 614 after assembly.

Figure 7:
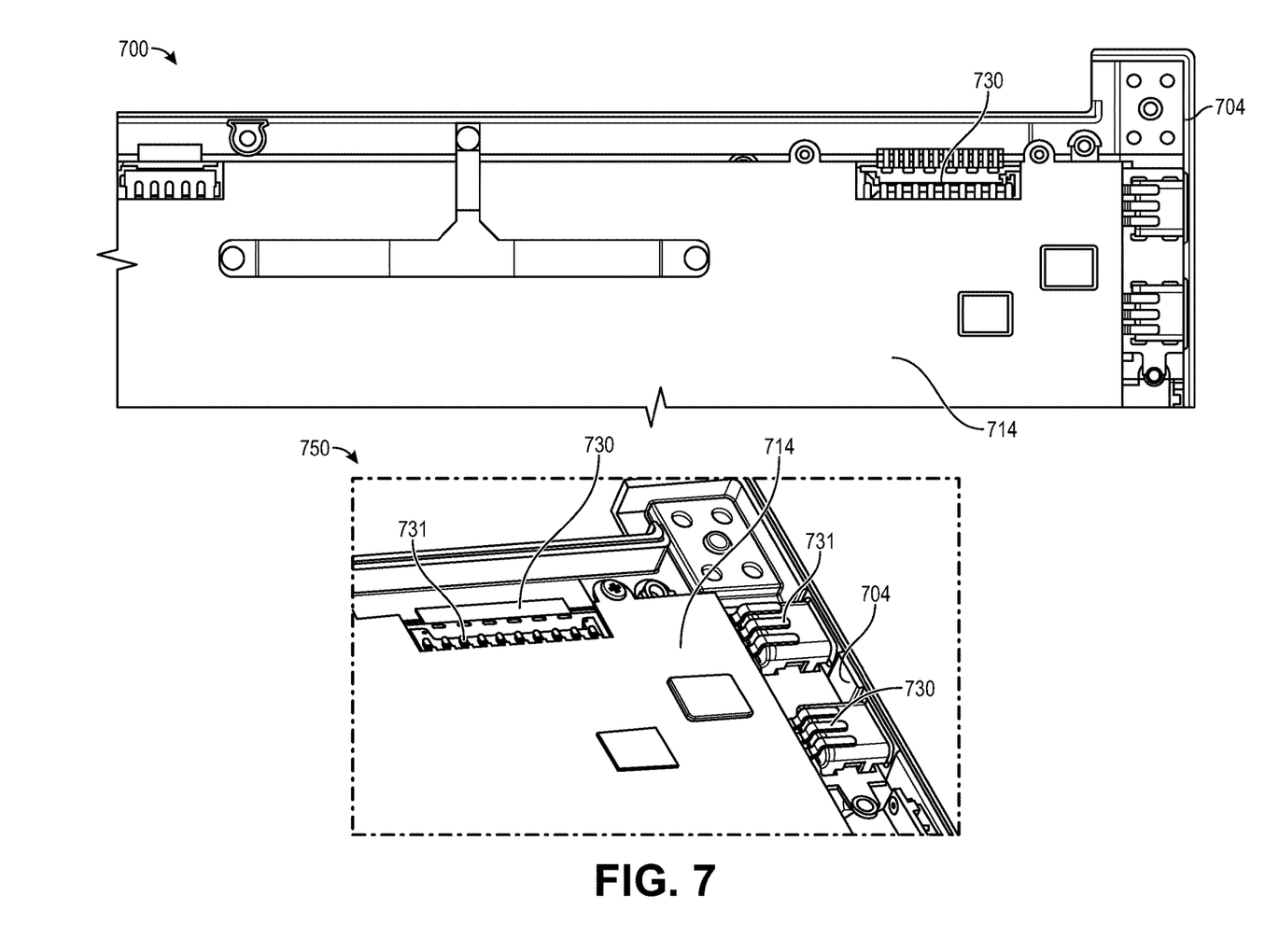
FIG. 7 shows an example electrical connector for a motherboard, in accordance with various embodiments.

FIG. 7 shows an example electrical connector for a motherboard, in accordance with various embodiments. Assembly 700 is a top-down view of a bottom chassis 704, which may be similar to bottom chassis 604 of FIG. 6. Assembly 750 is a detail of an aspect of assembly 700. A top EMI shield 714, that may be similar to top EMI shield 614 of FIG. 6, is physically coupled with the chassis. A motherboard, not shown but may be similar to motherboard 606 of FIG. 6, is disposed between the top EMI shield 714 and the bottom chassis 704. As discussed above, EMI walls, not shown but may be similar to EMI walls 618 of FIG. 6, may surround the motherboard (not shown) and may be in physical and electrical contact with an EMI gasket, not shown but similar to EMI gasket 625 of FIG. 6.

In embodiments, the motherboard may have various electrical connectors, such as electrical connectors 730 to enable the motherboard to send and receive electrical signals to components outside the motherboard. In embodiments, these electrical connectors 730 may cause openings in the EMI wall. Extended fingers 731 that are electrically coupled and that may be coupled with the top EMI shield electrically contact metal surface of the connectors. The openings can be electrically closed by extended fingers 731. Other electrical sealing mechanism may be used for the same purpose.

Figure 8:
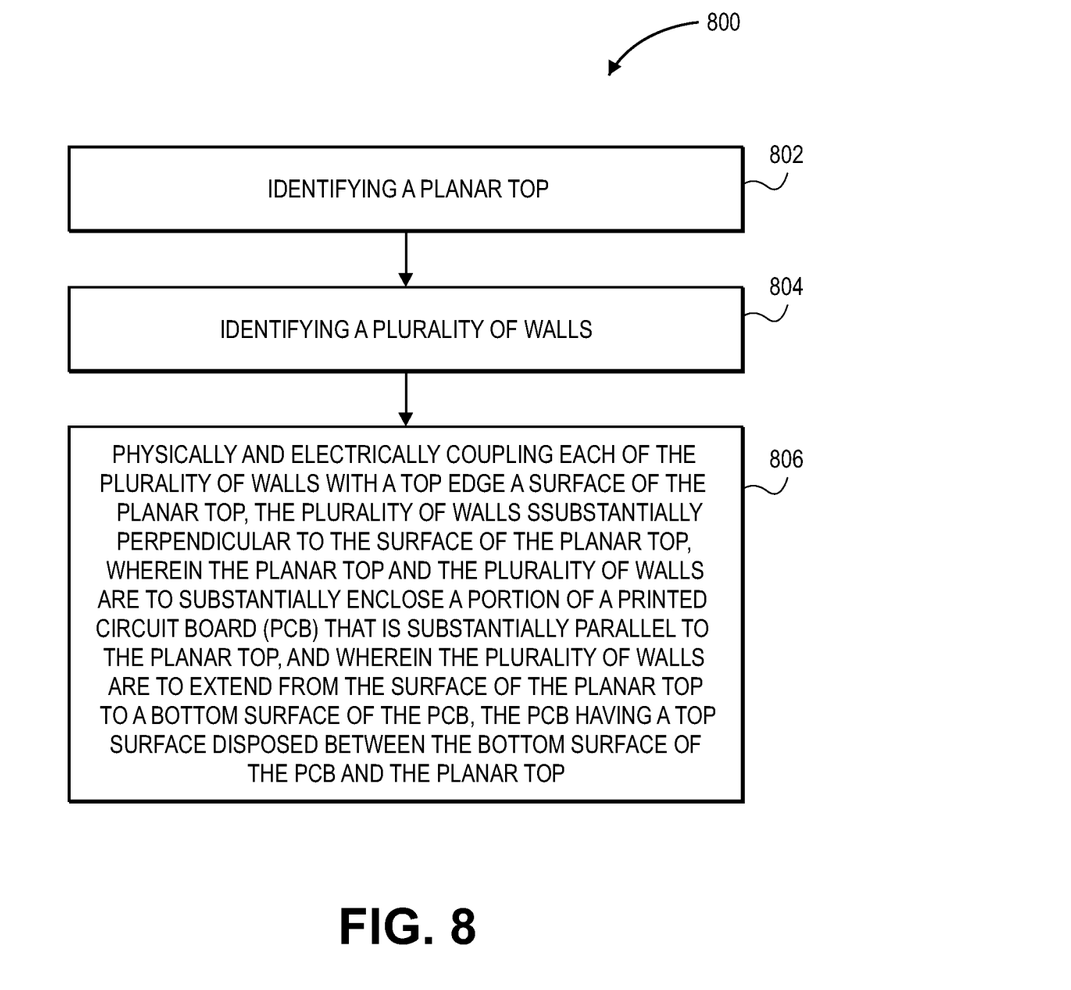
FIG. 8 is a process for assembling a top EMI shield and thermal solution that includes walls, in accordance with various embodiments.

FIG. 8 is a process for assembling a top EMI shield and thermal solution that includes walls, in accordance with various embodiments. Process 800 may be performed or facilitated by apparatus, systems, techniques, components, and/or processes described herein, and particularly with respect to FIG. 2-7.

At block 802, the process may include identifying a planar top. In embodiments, the planar top may be similar to top EMI shield 214 of FIG. 2, 414 of FIG. 4, 614 of FIG. 6, or 714 of FIG. 7. In embodiments, the planar top may serve as both a heatsink for various components, which may be similar to components 210 and die 208 of FIG. 2 that are coupled to a motherboard, which may be similar to motherboard 206. In other embodiments, the motherboard may be a PCB, or a substrate that may have components coupled with a side of the substrate.

At block 804, the process may include identifying a plurality of walls. In embodiments, these walls may be similar to EMI walls 218 of FIG. 2, 418 of FIG. 4, 618 of FIG. 6, and/or 718 of FIG. 7. In embodiments, these walls may be made of a similar material to the identified planar top of block 802.

At block 806, the process may include physically and electrically coupling each of the plurality of walls with a top edge a surface of the planar top, the plurality of walls substantially perpendicular to the surface of the planar top, wherein the planar top and the plurality of walls are to substantially enclose a portion of a PCB that is substantially parallel to the planar top, and wherein the plurality of walls are to extend from the surface of the planar top to a bottom surface of the PCB, the PCB having a top surface disposed between the bottom surface of the PCB and the planar top. In embodiments, the PCB may be similar to substrate 206 of FIG. 2, 306 of FIG. 3, and/or 606 of FIG. 6. In embodiments, the plurality of walls may be similar to EMI walls as described above.

In embodiments, the plurality of walls may each be walls separate from the planar top and subsequently attached to the planar top through welding, adhesives, or some other coupling mechanism that allows electrical coupling and thermal coupling. In embodiments, the plurality of walls may include solder placed upon the planar top. In other embodiments, the plurality of walls may have originally been a same piece of material as the planar top, where milling, etching, or some other process is used to remove portions of the material to expose the plurality of walls.

Figure 9:
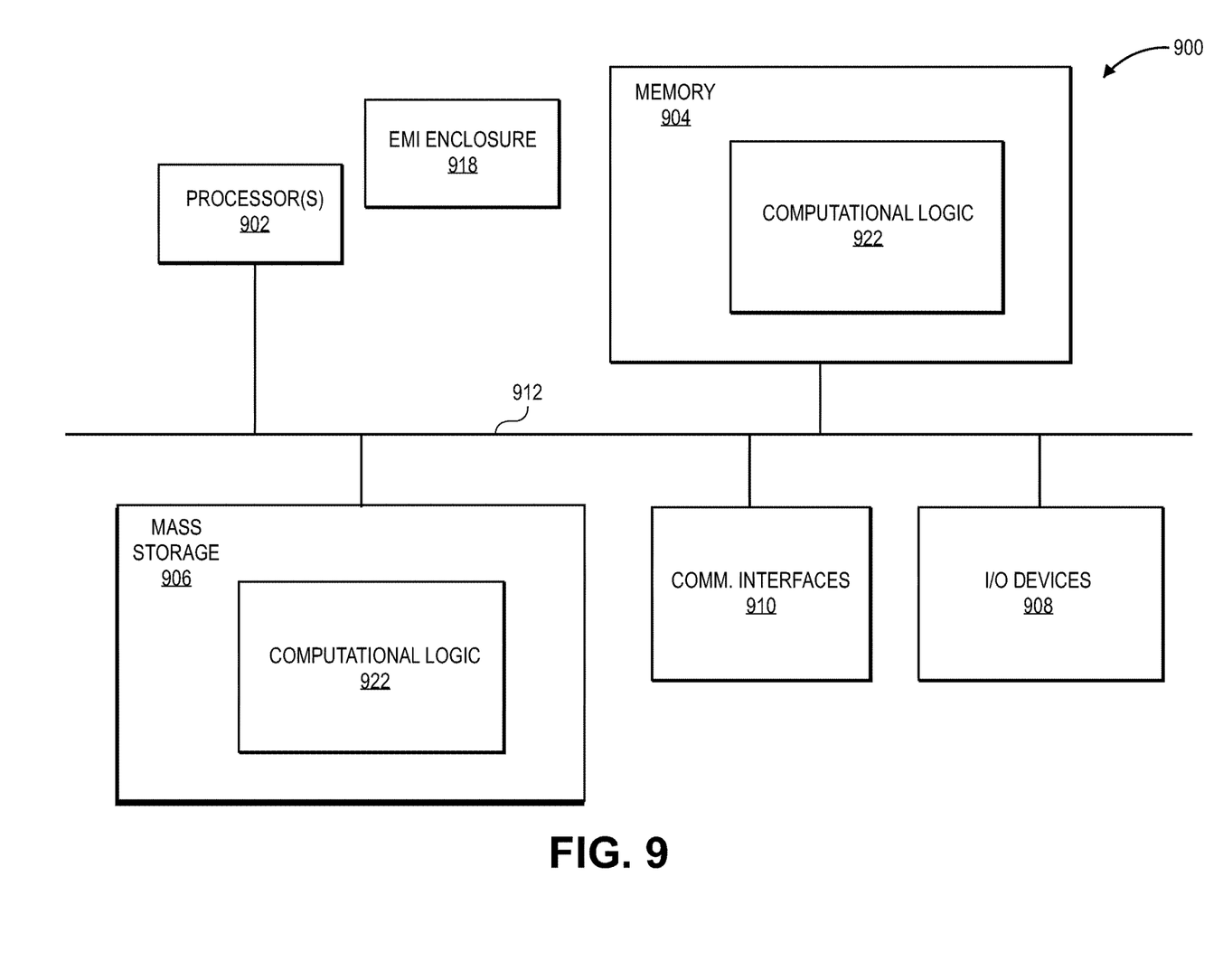
FIG. 9 illustrates an example computing device 1700 suitable for having various components of FIGS. 1-8, in accordance with various embodiments.

FIG. 9 illustrates an example computing device 900 suitable for having various components of FIGS. 1-8, in accordance with various embodiments.

As shown, computing device 900 may include one or more processors or processor cores 902, system memory 904, mass storage 906, communication interfaces 910 and I/O devices 908, coupled with each other via one or more buses/interconnects 912. In embodiments, processors 902 memory 904 and/or communication interfaces 910 may be mounted on a motherboard (not shown). Processors 902 memory 904 and/or communication interfaces 910 may be enclosed and shielded with the electromagnetic interference shielding enclosure with thermal conductivity of the present disclosure, denoted as EMI Enclosure 918 in FIG. 9. EMI enclosure 918 may be any one of the EMI enclosure embodiments earlier described with references to FIGS. 1-8.

For the purpose of this application, including the claims, the terms "processor" and "processor cores" may be considered synonymous, unless the context clearly requires otherwise. The processor 902 may include any type of processors, a microprocessor, and the like. The processor 902 may be implemented as an integrated circuit having multi-cores, e.g., a multi-core microprocessor.

Mass storage devices 906 may be one of diskette, hard drive, volatile memory (e.g., dynamic random-access memory (DRAM), compact disc read-only memory (CD-ROM), digital versatile disk (DVD), and so forth. In general, system memory 904 and/or mass storage devices 906 may be temporal and/or persistent storage of any type, including, but not limited to, volatile and non-volatile memory, optical, magnetic, and/or solid state mass storage, and so forth. Volatile memory may include, but is not limited to, static and/or dynamic random access memory. Non-volatile memory may include, but is not limited to, electrically erasable programmable read-only memory, phase change memory, resistive memory, and so forth.

I/O devices 908 may be a display (e.g., a touchscreen display)), keyboard, cursor control, remote control, gaming controller, image capture device, a camera, one or more sensors, and so forth and communication interfaces 910 may include network interface cards, serial buses, modems, infrared receivers, radio receivers (e.g., Bluetooth), and so forth).

The communication interfaces 910 may include communication chips (not shown) that may be configured to operate the device 900 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond.

System buses/Interconnects 912 may include, for example, PCIe buses. In other words, selected ones of processors 902, memory 904, mass storage 906, communication interfaces 910 and I/O devices 908 may be PCIe devices or other serial bus-based devices. In particular, they may be devices incorporated with the teachings of the present disclosure to couple with or include electromagnetic interference shielding enclosure with thermal conductivity. In the case of multiple buses, they may be bridged by one or more bus bridges (not shown).

Each of these elements may perform its conventional functions known in the art. In particular, system memory 904 and mass storage devices 906 may be employed to store a working copy and a permanent copy of the programming instructions for the operation of various components of computing device 900, including but not limited to an operating system of computing device 900, one or more applications, and/or system software/firmware in support of practice of the present disclosure, collectively referred to as computing logic 922. The various elements may be implemented by assembler instructions supported by processor(s) 902 or high-level languages that may be compiled into such instructions.

The permanent copy of the programming instructions may be placed into mass storage devices 906 in the factory, or in the field through, for example, a distribution medium (not shown), such as a compact disc (CD), or through communication interface 910 (from a distribution server (not shown)). That is, one or more distribution media having an implementation of the agent program may be employed to distribute the agent and to program various computing devices.

The number, capability, and/or capacity of the elements 902, 904, 906, 908, 910, and 912 may vary, depending on whether computing device 900 is used as a stationary computing device, such as a set-top box or desktop computer, or a mobile computing device, such as a tablet computing device, laptop computer, game console, or smartphone. Their constitutions are otherwise known, and accordingly will not be further described.

In embodiments, at least one of processors 902 may be packaged together with computational logic 922 configured to practice aspects of embodiments described herein to form a System in Package (SiP).

In various implementations, the computing device 900 may be one or more components of a data center, a laptop, a netbook, a notebook, an ultrabook, a smartphone, a tablet, a personal digital assistant (PDA), an ultra mobile PC, a mobile phone, a digital camera, or an IoT user equipment. In further implementations, the computing device 900 may be any other electronic device that processes data.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

Example 1 is an apparatus comprising: a planar top; one or more walls each with a top edge physically and electrically coupled with a surface of the planar top, the one or more walls substantially perpendicular to the surface of the planar top; wherein the planar top and the one or more walls are to substantially enclose a portion of a printed circuit board (PCB) that is substantially parallel to the planar top; and wherein the one or more walls are to extend from the surface of the planar top to a bottom surface of the PCB, the PCB having a top surface disposed between the bottom surface of the PCB and the planar top.

Example 2 may include the apparatus of example 1, where you in the planar top and the one or more walls include material that is thermally conductive or provides electromagnetic interference (EMI) shielding for one or more components disposed on the PCB within the enclosed portion of the PCB.

Example 3 may include the apparatus of example 1, wherein at least one of the one or more walls is to electrically couple with an electrical ground coupled with the PCB.

Example 4 may include the apparatus of example 3, wherein the electrical ground coupled with the PCB includes an electrical ground coupled with the bottom surface of the PCB.

Example 5 may include the apparatus of example 1, wherein the planar top and the one or more walls form a unibody construction.

Example 6 may include the apparatus of example 1, wherein a bottom edge of the one or more walls opposite the top edge are to couple with a chassis, wherein the PCB is disposed between the chassis and the enclosed portion of the PCB.

Example 7 may include the apparatus of example 6, wherein the chassis is to provide EMI shielding.

Example 8 may include the apparatus of example 6, wherein an EMI gasket to provide EMI shielding is to be positioned between the bottom edge of the one or more walls and the chassis.

Example 9 may include the apparatus of example 8, wherein the EMI gasket is thermally conductive.

Example 10 may include the apparatus of example 8, wherein the planar top and the one or more walls are to be removably coupled with the EMI gasket.

Example 11 may include the apparatus of example 1, wherein the planar top is to directly thermally couple with a component disposed on the enclosed portion of the PCB.

Example 12 may include the apparatus of any one of examples 1-11, wherein the planar top and the one or more walls include a selected one or more of: aluminum, copper, brass, nickel, tin, or steel.

Example 13 may be a method comprising: identifying a planar top; identifying a plurality of walls; physically and electrically coupling each of the plurality of walls with a top edge a surface of the planar top, the plurality of walls substantially perpendicular to the surface of the planar top, wherein the planar top and the plurality of walls are to substantially enclose a portion of a printed circuit board (PCB) that is substantially parallel to the planar top, and wherein the plurality of walls are to extend from the surface of the planar top to a bottom surface of the PCB, the PCB having a top surface disposed between the bottom surface of the PCB and the planar top.

Example 14 may include the method of example 13, wherein the planar top and the plurality of walls include material that is thermally conductive or provides electromagnetic interference (EMI) shielding for one or more components disposed on the PCB within the enclosed portion of the PCB.

Example 15 may include the method of any one of examples 13-14, wherein the planar top and the one or more walls include a selected one or more of: aluminum, copper, brass, nickel, tin, or steel.

Example 16 may be a system comprising: an electromagnetic interference (EMI) shield comprising: a planar top; one or more walls each with a top edge physically and electrically coupled with a surface of the planar top, the one or more walls substantially perpendicular to the surface of the planar top; wherein the planar top and the one or more walls are to substantially enclose a portion of a printed circuit board (PCB) that is substantially parallel to the planar top, wherein the one or more walls are to extend from the surface of the planar top to a bottom surface of the PCB, the PCB having a top surface disposed between the bottom surface of the PCB and the planar top, and wherein the planar top and the one or more walls include material that is thermally conductive and provides EMI shielding for one or more components within the enclosed portion of the PCB; and the PCB electrically coupled with the one or more walls.

Example 17 may include the system of example 16, wherein the PCB is electrically coupled with an electrical ground on the bottom surface of the PCB.

Example 18 may include the system of example 16, further comprising a chassis, wherein the PCB is disposed between the chassis and the planar top.

Example 19 may include the system of example 18, further comprising an EMI gasket physically coupled with the chassis and with the one or more walls, the EMI gasket to provide EMI shielding.

Example 20 may include the system of any one of examples 18-19, wherein the EMI shield and the one or more walls form a unibody structure.

What is claimed is:

1. An apparatus comprising:
   a printed circuit board (PCB) with a top surface and a bottom surface opposite the top surface;
   an electrical component coupled with the top surface of the PCB;
   an electromagnetic interference (EMI) shield, wherein a top of the EMI shield is substantially planar, and wherein the top of the EMI shield is above the component,
   wherein the EMI shield includes one or more walls that extend from the top of the EMI shield at least to the bottom surface of the PCB, wherein the top of the EMI shield and the one or more walls of the EMI shield at least partially surround a top and sides of the electrical component; and
   a chassis below the PCB, wherein the bottom surface of the PCB is coupled with a surface of the chassis, and wherein the one or more walls of the EMI shield electrically and physically couple with a top of the chassis.

2. The apparatus of claim 1, wherein the planar top and the one or more walls include material that is thermally conductive or provides electromagnetic interference (EMI) shielding for the electrical component.

3. The apparatus of claim 1, wherein at least one of the one or more walls is electrically coupled with an electrical ground coupled with the PCB.

4. The apparatus of claim 3, wherein the electrical ground coupled with the PCB includes an electrical ground coupled with the bottom surface of the PCB.

5. The apparatus of claim 1, wherein the planar top and one or more walls form a unibody construction.

6. The apparatus of claim 1, wherein the chassis provides EMI shielding for the component.

7. The apparatus of claim 1, further comprising an EMI gasket between a bottom edge of the one or more walls and the chassis.

8. The apparatus of claim 7, wherein the EMI gasket is thermally conductive.

9. The apparatus of claim 7, wherein the planar top and the one or more walls are removably coupled with the EMI gasket.

10. The apparatus of claim 1, wherein the planar top is directly thermally coupled with the component.

11. The apparatus of claim 1, wherein the planar top and the one or more walls include a selected one or more of: aluminum, copper, brass, nickel, tin, or steel.

12. A method comprising:
    identifying an electromagnetic interference (EMI) shield that includes a planar top and one or more walls extending down from the planar top;
    identifying a printed circuit board (PCB) having a top surface and a bottom surface opposite the top surface;
    placing a component on the top surface of the PCB;
    placing the EMI shield over the PCB and the component, wherein the one or more walls extend at least to the bottom surface of the PCB; and
    placing a chassis below the PCB, wherein the bottom surface of the PCB is coupled with a surface of the chassis, and wherein the one or more walls of the EMI shield electrically and physically couple with a top of the chassis.

13. The method of claim 12, wherein the planar top and the one or more walls include material that is thermally conductive or provides electromagnetic interference (EMI) shielding for the component.

14. The method of claim 12, wherein the planar top and the one or more walls include a selected one or more of: aluminum, copper, brass, nickel, tin, or steel.

15. A system comprising:
    an electromagnetic interference (EMI) shield comprising:
      a planar top; and
      one or more walls substantially perpendicular to the planar top;
    a printed circuit board (PCB) with a top surface and a bottom surface opposite the top surface, wherein the PCB is substantially parallel to the planar top;
    a component on the top surface of the PCB;
    wherein the EMI shield top is over the component and the one or more EMI walls extend to the bottom surface of the PCB and at least partially surround the component; and
    wherein the PCB is electrically coupled with the one or more walls; and
    a chassis below the PCB, wherein the bottom surface of the PCB is coupled with a surface of the chassis, and wherein the one or more walls of the EMI shield electrically and physically couple with a top of the chassis.

16. The system of claim 15, wherein the PCB is electrically coupled with an electrical ground on the bottom surface of the PCB.

17. The system of claim 15, further comprising a chassis below the PCB, wherein the one or more walls are electrically coupled with a top of the chassis.

18. The system of claim 17, further comprising an EMI gasket physically coupled with the chassis and with the one or more walls.

19. The system of claim 17, wherein the EMI shield and the one or more walls form a unibody structure.

* * * * *